(12) United States Patent
Suzuki

(10) Patent No.: US 9,854,130 B2
(45) Date of Patent: Dec. 26, 2017

(54) IMAGE READING APPARATUS AND SEMICONDUCTOR DEVICE

(71) Applicant: SEIKO EPSON CORPORATION, Tokyo (JP)

(72) Inventor: Takafumi Suzuki, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/376,903

(22) Filed: Dec. 13, 2016

(65) Prior Publication Data

US 2017/0237877 A1    Aug. 17, 2017

(30) Foreign Application Priority Data

Feb. 12, 2016   (JP) ................................. 2016-025091

(51) Int. Cl.
| | |
|---|---|
| H04N 1/04 | (2006.01) |
| H04N 1/40 | (2006.01) |
| H01L 27/146 | (2006.01) |
| H01L 27/148 | (2006.01) |
| H04N 5/369 | (2011.01) |
| H04N 1/031 | (2006.01) |
| H04N 1/401 | (2006.01) |

(52) U.S. Cl.
CPC ... *H04N 1/40056* (2013.01); *H01L 27/14636* (2013.01); *H01L 27/14643* (2013.01); *H01L 27/14825* (2013.01); *H04N 1/031* (2013.01); *H04N 1/401* (2013.01); *H04N 5/3694* (2013.01); *H04N 5/3698* (2013.01); *H04N 2201/0081* (2013.01)

(58) Field of Classification Search
CPC .... H04N 1/40056; H04N 1/031; H04N 1/401; H04N 2201/0081
USPC ................................................... 358/446, 474
See application file for complete search history.

(56) References Cited

U.S. PATENT DOCUMENTS

| | | | |
|---|---|---|---|
| 8,581,361 B2 | 11/2013 | Ogura et al. | |
| 2016/0091817 A1* | 3/2016 | Yokoi | B41J 2/45 399/51 |
| 2017/0187920 A1* | 6/2017 | Suzuki | H04N 1/40056 |

FOREIGN PATENT DOCUMENTS

JP         2012-134257 A      7/2012

* cited by examiner

*Primary Examiner* — Houshang Safaipour
(74) *Attorney, Agent, or Firm* — Global IP Counselors, LLP

(57) ABSTRACT

An image reading apparatus includes an image reading chip for reading an image. The image reading chip includes a plurality of pixel units which include a light receiving element which receives light from the image so as to perform photoelectric conversion, an analog circuit, a logic circuit, and a power source pad to which a power source voltage is supplied. The image reading chip has a shape which includes a first side and a second side shorter than the first side. A distance between the analog circuit and a median point of the first side is shorter than a distance between the logic circuit and the median point of the first side, and a distance between the analog circuit and the power source pad is shorter than a distance between the logic circuit and the power source pad.

12 Claims, 9 Drawing Sheets

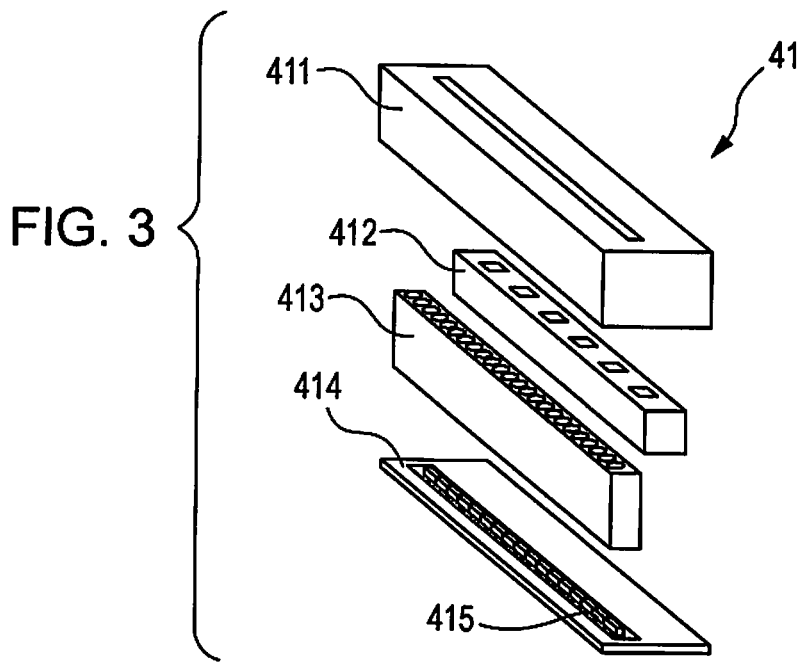
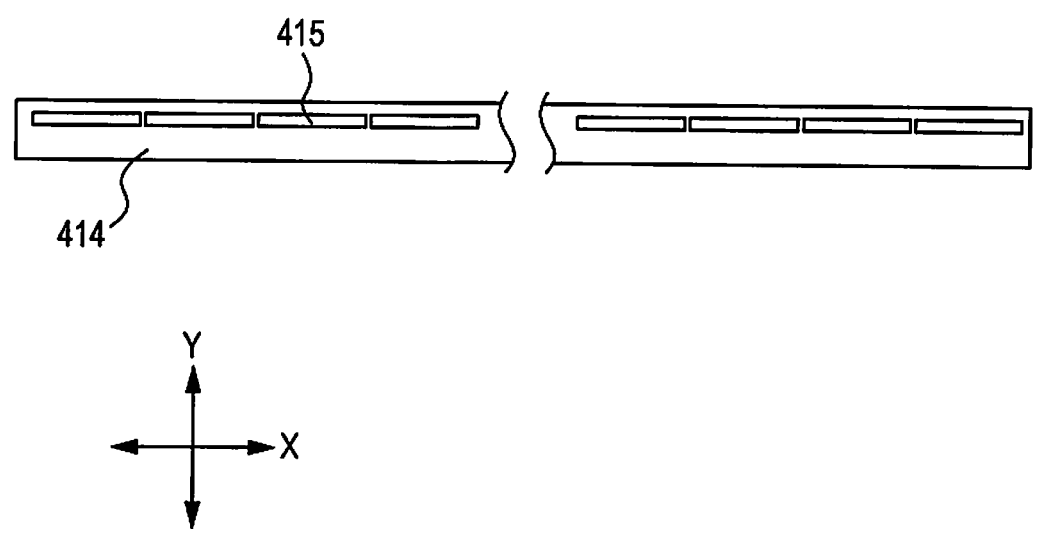

IMAGE READING APPARATUS AND SEMICONDUCTOR DEVICE

The entire disclosure of Japanese Patent Application No. 2016-025091, filed Feb. 12, 2016 is expressly incorporated by reference herein.

BACKGROUND

1. Technical Field

The present invention relates to an image reading apparatus and a semiconductor device.

2. Related Art

An image reading apparatus (scanner and the like) using a contact image sensor, and a copying machine, a combination printer, or the like to which a printing function has been added have been developed. As the contact image sensor used in the image reading apparatus, a configuration of using a photodiode provided on a semiconductor substrate is used.

In the contact image sensor used in the image reading apparatus such as a scanner, multiple pixel units of which each includes one or a plurality of photodiodes are disposed in line in one direction. Thus, a chip shape thereof is a very elongated rectangular shape. Because the length of a long side of the chip is determined by the size of a pixel (photodiode) or the number of pixels, only a method of reducing a short side of the chip is provided in order to reduce the chip size. Various pads (terminals) such as an input pad, an output pad, and a power source pad, and various circuits such as an input and output circuit, a control circuit, and a pixel drive circuit are provided in a region other than an arrangement region of pixel units in the chip. The number of bondings between the chip and a circuit board is desirably small. In order to cause the number of pads to be necessarily the minimum, the pads are arranged in the vicinity of the long side of the chip, and the various circuits are arranged in an empty region between the pads. Accordingly, it is possible to reduce the length of the chip in a short-side direction.

JP-A-2012-134257 discloses a solid state imaging device in which a circuit is disposed between pads, and a signal wiring passes under the pads, and thus it is possible to reduce a chip area.

In a case where only one pair of power source pads is provided in order to reduce the number of pads, a long power source wiring in a long-side direction of a chip is required to be provided in order to supply power to various circuits. However, as the power source wiring becomes farther from the power source pad, the dropped amount of a power source voltage by a resistive component of the power source wiring is increased. Thus, the position of the power source pad or the layout of the power source wiring has a large influence on characteristics of an imaging sensor. In the solid state imaging device disclosed in JP-A-2012-134257, power source pads are provided at both ends of the chip on the long side thereof. Thus, the dropped amount of a power source voltage is large in the vicinity of the center of the chip on the long side thereof, and this may cause the characteristics to be largely degraded. Further, since the signal wiring passes under the pads, there is a problem in reliability of bonding pads or the signal wiring. That is, in the solid state imaging device disclosed in JP-A-2012-134257, the position of the power source pad or the layout of the power source wiring for improving characteristics of an imaging sensor is not totally considered.

SUMMARY

An advantage of some aspects of the invention is to provide an image reading apparatus in which power is stably supplied to various circuits in an image reading chip, and thus it is possible to improve capability for reading an image. Another advantage of some aspects of the invention is to provide a semiconductor device in which power is stably supplied to various circuits, and thus it is possible to improve capability for reading an image.

The invention can be realized in the following aspects or application examples.

Application Example 1

According to this application example, there is provided an image reading apparatus which includes an image reading chip for reading an image. The image reading chip includes a plurality of pixel units which include a light receiving element which receives light from the image so as to perform photoelectric conversion, an analog circuit, a logic circuit, and a power source pad to which a power source voltage is supplied. The image reading chip has a shape which includes a first side and a second side shorter than the first side. The plurality of pixel units is arranged in a line in a direction along the first side. A distance between the analog circuit and a median point of the first side is shorter than a distance between the logic circuit and the median point of the first side, and a distance between the analog circuit and the power source pad is shorter than a distance between the logic circuit and the power source pad.

The image reading chip may have the above configuration only on one side from the center of the chip, or may have the above configuration on both sides of the chip.

In the image reading apparatus according to this application example, since the plurality of pixel units is arranged in a line in the direction along the first side in the image reading chip, the power source wiring in the direction along the first side is long. However, since the analog circuit is disposed at a position which is an inner side of the logic circuit (close to the center of the chip) and is nearer to the power source pad than the logic circuit in the image reading chip, the power source wiring from the power source pad to the analog circuit is relatively short, and the dropped or raised amount of the power source voltage due to wiring resistance is small. It is difficult to cause the analog circuit to receive an influence of power source noise occurring by a switching operation in the logic circuit. Thus, according to the image reading apparatus in this application example, power is stably supplied to the analog circuit of which characteristics easily fluctuate by the power source voltage, and thus it is possible to improve capability for reading an image.

Application Example 2

In the image reading apparatus according to the application example, the image reading chip may include an input pad for inputting an input signal to the image reading chip, and an output pad for outputting an output signal from the image reading chip. A distance between the power source pad and the median point of the first side may be shorter than a distance between the input pad and the median point of the first side, and be shorter than a distance between the output pad and the median point of the first side.

In the image reading apparatus according to this application example, in the image reading chip, since the power source pad is disposed on an inner side (close to the center of the chip) of the input pad or the output pad, it is possible to reduce a distance between the power source pad and a circuit which is farthest from the power source pad, in comparison to a case where the power source pad is disposed to be close to an end of the chip. Thus, according to the image reading apparatus in this application example, power is stably supplied to various circuits, and thus it is possible to improve capability for reading an image.

Application Example 3

In the image reading apparatus according to the application example, the analog circuit, the logic circuit, the power source pad, the input pad, and the output pad may be arranged in the direction along the first side.

According to the image reading apparatus in this application example, in the image reading chip, since the analog circuit or the logic circuit is disposed on the outside of the pads or between the pads, it is possible to reduce the length of the second side and to reduce a chip area.

Application Example 4

In the image reading apparatus according to the application example, the image reading chip may include a first power source wiring for electrically connecting the analog circuit and the power source pad, and a second power source wiring for electrically connecting the logic circuit and the power source pad. The first power source wiring and the second power source wiring may be branched at a position of the power source pad.

According to the image reading apparatus in this application example, in the image reading chip, the analog circuit of which characteristics easily fluctuate by the power source voltage receives power which is stably supplied through the first power source wiring, so as to perform an operation, and the first power source wiring is separated from the second power source wiring. Thus, propagation of power source noise occurring by the switching operation of the logic circuit is difficult, and thus it is possible to improve capability for reading an image.

Application Example 5

In the image reading apparatus according to the application example, the power source pad may include a first power source pad to which a first power source voltage is supplied, and a second power source pad to which a second power source voltage lower than the first power source voltage is supplied.

In the image reading apparatus according to this application example, in the image reading chip, the analog circuit is disposed at a position which is an inner side of the logic circuit (close to the center of the chip) and is nearer to the first power source pad and the second power source pad than the logic circuit. Thus, both of the power source wiring from the first power source pad to the analog circuit, and the power source wiring from the second power source pad to the analog circuit are relatively short, and the dropped or raised amount of the power source voltage due to wiring resistance is small. It is difficult to cause the analog circuit to receive an influence of power source noise occurring by a switching operation in the logic circuit. Thus, according to the image reading apparatus in this application example, power is stably supplied to the analog circuit of which characteristics easily fluctuate by the power source voltage, and thus it is possible to improve capability for reading an image.

Application Example 6

In the image reading apparatus according to the application example, the power source pad may include a first power source pad to which a first power source voltage is supplied, and a second power source pad to which a second power source voltage lower than the first power source voltage is supplied. The image reading chip may include a first power source wiring for electrically connecting the analog circuit and the first power source pad, a second power source wiring for electrically connecting the logic circuit and the first power source pad, a third power source wiring for electrically connecting the analog circuit and the second power source pad, and a fourth power source wiring for electrically connecting the logic circuit and the second power source pad. In a plan view of the image reading chip, the first power source wiring and the second power source wiring may be provided so as not to overlap the second power source pad, and the third power source wiring and the fourth power source wiring may be provided so as not to overlap the first power source pad.

According to the image reading apparatus in this application example, in the image reading chip, the first power source wiring and the second power source wiring do not overlap the second power source pad, and the third power source wiring and the fourth power source wiring do not overlap the first power source pad. Thus, all of the first power source wiring, the second power source wiring, the third power source wiring, and the fourth power source wiring may be realized in the same wiring layer as that for the first power source pad and the second power source pad. Thus, wiring layers for the first power source wiring (or the second power source wiring) and the third power source wiring (or the fourth power source wiring) may be different from each other only at a portion at which the first power source wiring or the second power source wiring to which the first power source voltage is transmitted overlaps the third power source wiring or the fourth power source wiring to which the second power source voltage is transmitted. Thus, all of the first power source wiring, the second power source wiring, the third power source wiring, the fourth power source wiring, the first power source pad, and the second power source pad may be realized only in two wiring layers. Thus, it is possible to simplify manufacturing processes, and to reduce cost of manufacturing an image reading chip.

Application Example 7

In the image reading apparatus according to the application example, the analog circuit may include a voltage boosting circuit configured to boost the power source voltage.

According to the image reading apparatus in this application example, in the image reading chip, power is stably supplied to the voltage boosting circuit which needs large power, and thus it is possible to improve capability for reading an image.

Application Example 8

In the image reading apparatus according to the application example, the analog circuit may include a pixel drive circuit configured to generate a drive signal for driving the pixel unit.

According to the image reading apparatus in this application example, in the image reading chip, power is stably supplied to the pixel drive circuit, and thus it is possible to suppress fluctuation of a timing of supplying the drive signal to the pixel unit, and to improve capability for reading an image.

Application Example 9

In the image reading apparatus according to the application example, the analog circuit may include a noise reduction circuit configured to reduce noise included in an output signal output from the pixel unit.

According to the image reading apparatus in this application example, in the image reading chip, power is stably supplied to the noise reduction circuit of which characteristics largely fluctuate by the power source voltage, and thus it is possible to improve capability for reading an image.

Application Example 10

In the image reading apparatus according to the application example, the analog circuit may include an amplification circuit configured to amplify an output signal output from the pixel unit.

According to the image reading apparatus in this application example, in the image reading chip, power is stably supplied to the amplification circuit of which characteristics largely fluctuate by the power source voltage, and thus it is possible to improve capability for reading an image.

Application Example 11

In the image reading apparatus according to the application example, the analog circuit may include a voltage boosting circuit configured to boost the power source voltage, a pixel drive circuit configured to generate a drive signal for driving the pixel unit, a noise reduction circuit configured to reduce noise included in an output signal output from the pixel unit, and an amplification circuit configured to amplify the output signal. The voltage boosting circuit and the pixel drive circuit may be provided at a position which is nearer to the first power source pad than the second power source pad. The noise reduction circuit and the amplification circuit may be provided at a position which is nearer to the second power source pad than the first power source pad.

According to the image reading apparatus in this application example, in the image reading chip, the voltage boosting circuit which needs large power, and the pixel drive circuit that generates a drive signal of which a timing easily fluctuates are near the first power source pad, and are relatively near from the second power source pad. Thus, it is possible to stably supply power to the voltage boosting circuit and the pixel drive circuit. The noise reduction circuit and the amplification circuit of which characteristics largely fluctuate by the power source voltage are near the second power source pad, and are relatively near from the first power source pad. Thus, it is possible to stably supply power to the noise reduction circuit and the amplification circuit. Accordingly, it is possible to improve capability for reading an image.

Application Example 12

According to this application example, there is provided a semiconductor device which has a shape including a first side and a second side shorter than the first side. The semiconductor device includes a plurality of pixel units which include a light receiving element which receives light so as to perform photoelectric conversion, an analog circuit, a logic circuit, and a power source pad to which a power source voltage is supplied. The plurality of pixel units is arranged in a line in a direction along the first side. A distance between the analog circuit and a median point of the first side is shorter than a distance between the logic circuit and the median point of the first side, and a distance between the analog circuit and the power source pad is shorter than a distance between the logic circuit and the power source pad.

In the semiconductor device according to this application example, since the plurality of pixel units is arranged in a line in the direction along the first side, the power source wiring in the direction along the first side is long. However, since the analog circuit is disposed at a position which is an inner side of the logic circuit (close to the center) and is nearer to the power source pad than the logic circuit, the power source wiring from the power source pad to the analog circuit is relatively short, and the dropped or raised amount of the power source voltage due to wiring resistance is small. It is difficult to cause the analog circuit to receive an influence of power source noise occurring by a switching operation in the logic circuit. Thus, according to the semiconductor device in this application example, power is stably supplied to the analog circuit of which characteristics easily fluctuate by the power source voltage, and thus it is possible to improve capability for reading an image.

BRIEF DESCRIPTION OF THE DRAWINGS

The invention will be described with reference to the accompanying drawings, wherein like numbers reference like elements.

FIG. 3 is an exploded perspective view schematically illustrating a configuration of an image sensor module.

FIG. 4 is a plan view schematically illustrating a disposition of an image reading chip.

DESCRIPTION OF EXEMPLARY EMBODIMENTS

Hereinafter, a preferred exemplary embodiment according to the invention will be described in detail with reference to the drawings. The drawings are used to aid in the descriptions. The exemplary embodiment which will be described below does not unreasonably limit the details of aspects of the invention described in claims. All components of a configuration which will be described below are not limited as necessary components for the aspect of the invention.

Hereinafter, a combination machine (combination device) 1 to which an image reading apparatus according to an aspect of the invention will be described in detail with reference to the accompanying drawings.

1. Structure of Combination Machine

Figure 1:
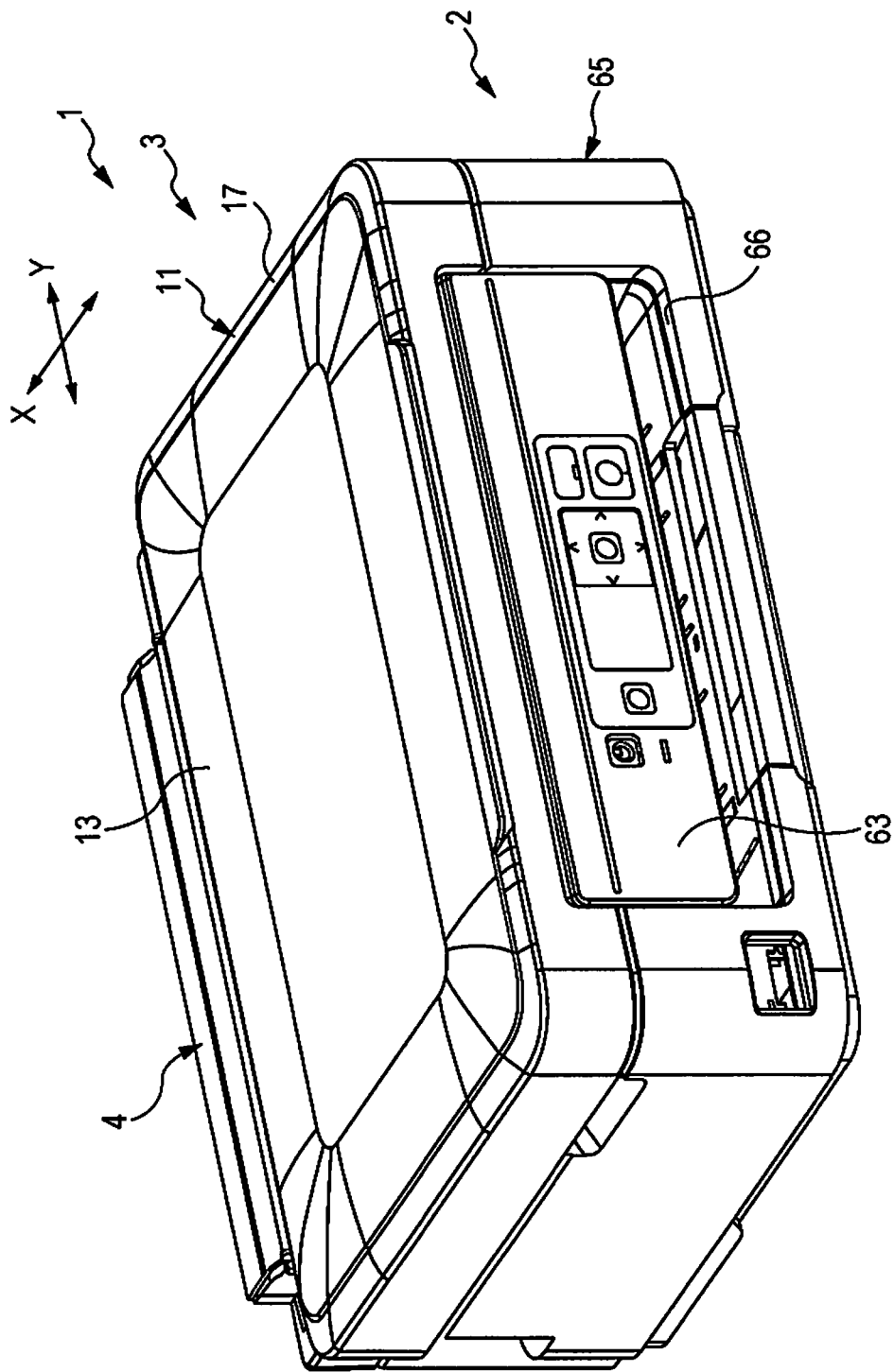
FIG. 1 is an external perspective view illustrating a combination machine according to an exemplary embodiment.

FIG. 1 is an external perspective view illustrating the combination machine 1. As illustrated in FIG. 1, the combination machine 1 integrally includes a printer unit (image recording device) 2 which corresponds to a device main body, and a scanner unit (image reading apparatus) 3. The scanner unit 3 corresponds to an upper unit which is disposed at an upper portion of the printer unit 2. Descriptions will be made on the assumption that a front-rear direction in FIG. 1 is an X axis direction and a crosswise direction is a Y axis direction.

As illustrated in FIG. 1, the printer unit 2 includes a transport unit (not illustrated), a print unit (not illustrated), an operation unit 63, a device frame (not illustrated), and a device housing 65. The transport unit sends a recording medium (print paper or cutform paper) corresponding to a sheet of paper, along a feeding path. The print unit is disposed over the feeding path, and performs ink jet printing on the recording medium. The operation unit 63 has a panel form, and is disposed on the front surface. The transport unit, the print unit, and the operation unit 63 are mounted in the device frame. The device housing 65 covers the above components. An exit port 66 through which a recording medium on which printing is ended exits is provided on the device housing 65. Although not illustrated, a USB port and a power port are disposed at a lower portion of the rear surface. That is, the combination machine 1 is configured so as to be allowed to be connected to a computer and the like via the USB port.

The scanner unit 3 is supported so as to be rotatable around the printer unit 2 through the hinge portion 4 at a rear end portion. The scanner unit 3 covers an upper portion of the printer unit 2 so as to be freely opened or closed. That is, the scanner unit 3 is raised in a rotational direction, thereby exposing the upper-surface opening portion of the printer unit 2, and the inside of the printer unit 2 is exposed through the opening portion on the upper-surface opening portion. The scanner unit 3 is lowered in the rotational direction, and is mounted on the printer unit 2, and thus the upper-surface opening portion is closed by the scanner unit 3. In this manner, the scanner unit 3 is opened, and thus exchange of an ink cartridge, solving paper jam, or the like can be performed.

Figure 2:
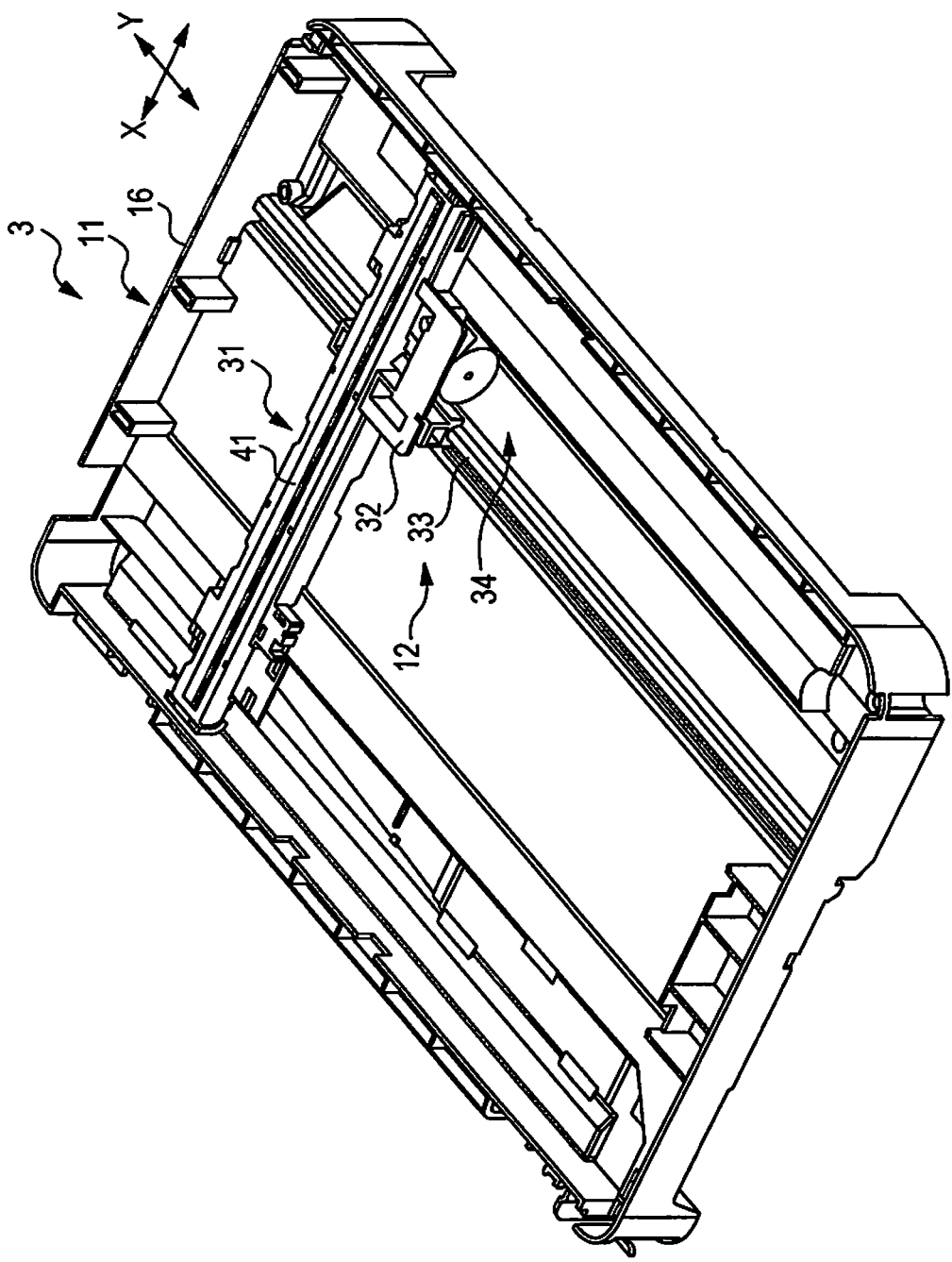
FIG. 2 is a perspective view illustrating an internal structure of a scanner unit.

FIG. 2 is a perspective view illustrating an internal structure of the scanner unit 3. As illustrated in FIGS. 1 and 2, the scanner unit 3 includes an upper frame 11 which is a housing, an image reading unit 12 accommodated in the upper frame 11, and an upper lid 13 supported by an upper portion of the upper frame 11. The upper lid 13 is supported so as to be rotatable. As illustrated in FIG. 2, the upper frame 11 includes a box type lower case 16 which accommodates the image reading unit 12, and an upper case 17 which covers the top surface of the lower case 16. A document mounting panel (document stand not illustrated) formed of glass is widely disposed on the upper case 17. A read medium (original document) of which a read surface is positioned downwardly is mounted on this document mounting panel. The lower case 16 is formed so as to have a shallow box shape of which an upper surface is opened.

As illustrated in FIG. 2, the image reading unit 12 includes a sensor unit 31 of a line sensor type, a sensor carriage 32 in which the sensor unit 31 is mounted, a guide shaft 33 which is extended in the Y axis direction, and slidably supports the sensor carriage 32, and a self-traveling sensor moving mechanism 34 which moves the sensor carriage 32 along the guide shaft 33. The sensor unit 31 includes an image sensor module 41 which is a complementary metal-oxide-semiconductor (CMOS) line sensor extended in the X axis direction. The sensor moving mechanism 34 is driven in the Y axis direction by a motor, and thus the sensor unit 31 performs reciprocation along the guide shaft 33. Thus, an image of the read medium (original document) on the document mounting panel is read. The sensor unit 31 may be a charge coupled device (CCD) line sensor.

FIG. 3 is an exploded perspective view schematically illustrating a configuration of the image sensor module 41. In the example illustrated in FIG. 3, the image sensor module 41 includes a case 411, a light source 412, a lens 413, a module substrate 414, and an image reading chip (semiconductor device) 415 for reading an image. The light source 412, the lens 413, and the image reading chip 415 are accommodated between the case 411 and the module substrate 414. A slit is provided in the case 411. The light source 412 includes, for example, light emitting diodes (LED) of R, G, and B. The light emitting diodes (LED) of R, G, and B (red LED, green LED, and blue LED) sequentially emit light while being rapidly switched. Light emitted by the light source 412 is applied to a read medium through the slit, and light from the read medium is input to the lens 413 through the slit. The lens 413 guides the input light to the image reading chip 415.

FIG. 4 is a schematic plan view illustrating a disposition of the image reading chip 415. As illustrated in FIG. 4, a plurality (m pieces) of image reading chips 415 is arranged on the module substrate 414 in parallel in an one-dimensional direction (X axis direction in FIG. 4). Each of the image reading chips 415 includes multiple light receiving elements which are disposed in a line (see FIGS. 6, 7, and 9). As the density of the light receiving elements provided in each of the image reading chip 415 increases, the scanner unit (image reading apparatus) 3 having a high resolution for reading an image can be realized. As the number of the image reading chips 415 increases, the scanner unit (image reading apparatus) 3 capable of also reading large images can be realized.

2. Functional Configuration of Scanner Unit (Image Reading Apparatus)

Figure 5:
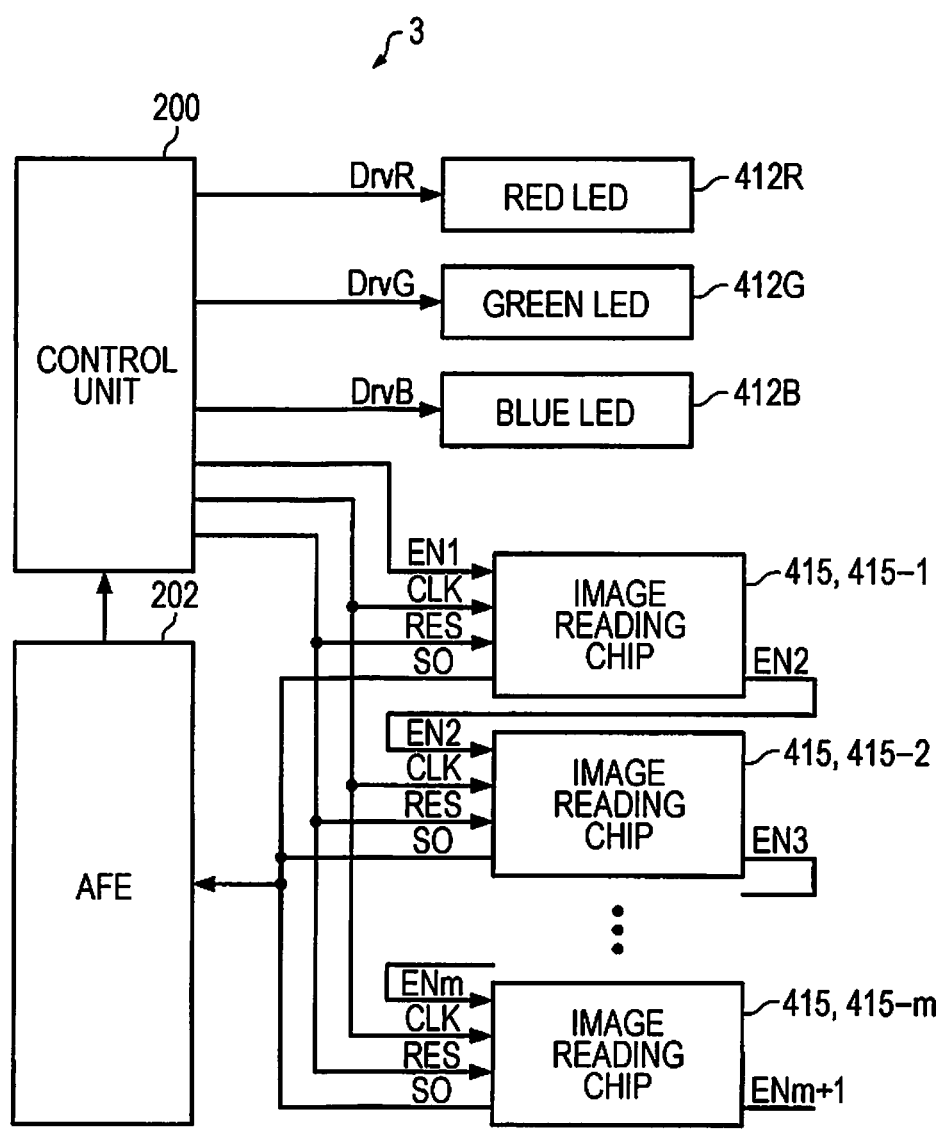
FIG. 5 is a diagram illustrating a functional configuration of the scanner unit.

FIG. 5 is a functional block diagram illustrating a functional configuration of the scanner unit (image reading apparatus) 3. In the example illustrated in FIG. 5, the scanner unit (image reading apparatus) 3 includes a control unit 200, an analog front end (AFE) 202, a red LED 412R, a green LED 412G, a blue LED 412B, and m pieces of image reading chips 415 (415-1 to 415-m). As described above, the red LED 412R, the green LED 412G, and the blue LED 412B include the light source 412. The plurality of image reading chips 415 is disposed on the module substrate 414 in parallel. A plurality of red LEDs 412R, a plurality of green LEDs 412G, and a plurality of blue LEDs 412B may be provided. The control unit 200 and the analog front end (AFE) 202 are provided on the module substrate 414 or a substrate (not illustrated) which is different from the module substrate 414. Each of the control unit 200 and the analog front end (AFE) 202 may be realized by an integrated circuit (IC).

The control unit 200 supplies a drive signal DrvR to the red LED 412R on a predetermined cycle T, by a predetermined exposure time Δt, and thus causes the red LED 412R to emit light. Similarly, the control unit 200 supplies a drive signal DrvG to the green LED 412G on the cycle T, by the exposure time Δt, and thus causes the green LED 412G to emit light. The control unit 200 supplies a drive signal DrvB to the blue LED 412B on the cycle T, by the exposure time Δt, and thus causes the blue LED 412B to emit light. The control unit 200 causes the red LED 412R, the green LED 412G, and the blue LED 412B to exclusively emit light one by one in this order for the cycle T.

The control unit 200 commonly supplies a clock signal CLK and a resolution setting signal RES to m pieces of the image reading chips 415 (415-1 to 415-*m*). The clock signal CLK is an operation clock signal for the image reading chip 415. The resolution setting signal RES is a signal for setting a resolution at which the scanner unit (image reading apparatus) 3 reads an image. The resolution is set in accordance with the number of rising edges of the clock signal CLK for a duration when the resolution setting signal RES is active (high level in the exemplary embodiment). In the exemplary embodiment, when the number of rising edges of the clock signal CLK for the duration when the resolution setting signal RES is active (high level) is 2, 4, and 8, it is assumed that a resolution of 300 dpi, 600 dpi, and 1200 dpi is set respectively.

Each of the image reading chips 415-*j* (j=1 to m) receives light from an image which is formed on the read medium by each of the light receiving elements. Then, each of the image reading chips 415-*j* (j=1 to m) performs synchronization with the clock signal CLK for a duration when a chip enable signal ENj is active (high level in the exemplary embodiment), generates an image signal SO based on light received by each of the light receiving elements. The image signal SO contains image information of a resolution set by the resolution setting signal RES. The image reading chips 415-*j* (j=1 to m) outputs the generated image signal SO. In the exemplary embodiment, the control unit 200 causes the red LED 412R, the green LED 412G, or the blue LED 412B to emit light. Then, the control unit 200 generates a chip enable signal EN1 which is set to be active (high level) for a predetermined period (period until the image reading chip 415-1 ends an output of the image signal SO). The control unit 200 supplies the generated chip enable signal EN1 to the image reading chip 415-1. The image reading chip 415-*j* (j=1 to m) ends the output of the image signal SO, and then generates a chip enable signal ENj+1 which is set to be active (high level) for a predetermined period (period until the image reading chip 415-*j*+1 ends an output of the image signal SO). The image reading chip 415-*j* (j=1 to m) supplies the generated chip enable signal ENj+1 to the image reading chip 415-*j*+1. Thus, after the red LED 412R, the green LED 412G, or the blue LED 412B emits light, m pieces of the image reading chips 415 (415-1 to 415-*m*) sequentially output image signals SO. A circuit configuration and an operation of the image reading chip 415 will be described later in detail.

The analog front end (AFE) 202 reads the image signals SO which are sequentially output by m pieces of the image reading chips 415 (415-1 to 415-*m*), and performs amplification or A/D conversion on each of the image signals SO. The analog front end (AFE) 202 converts each of the image signals SO into a digital signal which has a digital value depending on the intensity of the received light of each of the light receiving elements. The analog front end CAFE) 202 sequentially transmits digital signals to the control unit 200.

The control unit 200 receives the digital signals which are sequentially transmitted from the analog front end CAFE) 202, and generates image information which has been read by the image sensor module 41.

3. Configuration and Operation of Image Reading Chip

Figure 6:
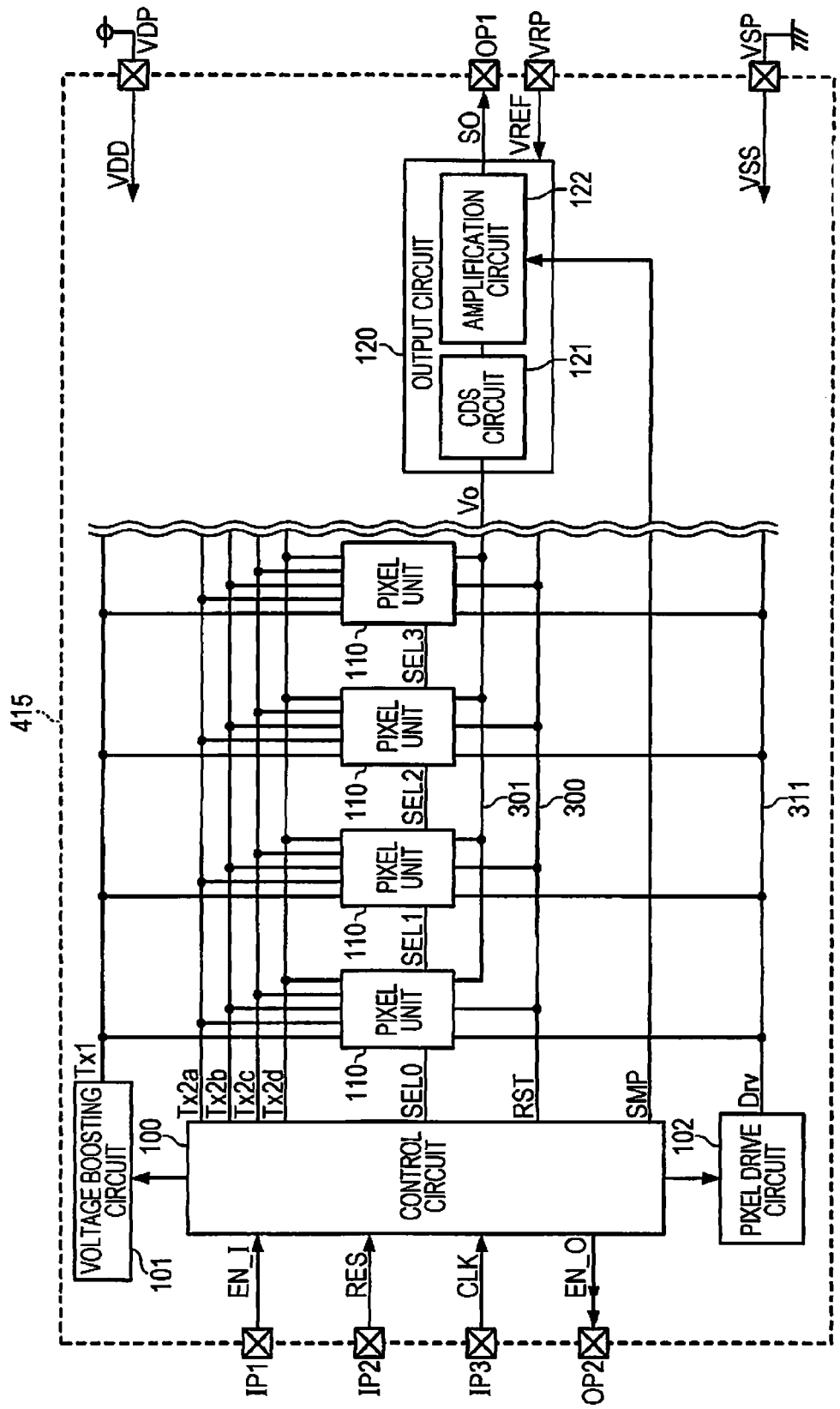
FIG. 6 is a functional block diagram illustrating the image reading chip.

FIG. 6 is a functional block diagram illustrating the image reading chip 415. The image reading chip 415 illustrated in FIG. 6 includes a control circuit 100, a voltage boosting circuit 101, a pixel drive circuit 102, n pieces of pixel units 110, and an output circuit 120. A power source voltage (for example, 3.3 V) VDD and a power source voltage (for example, 0 V) VSS are supplied from two power source terminals VDP and VSP to the image reading chip 415. The image reading chip 415 operates based on a chip enable signal EN_I (any of chip enable signals EN1 to ENm in FIG. 5), a resolution setting signal RES, a clock signal CLK, and a reference voltage VREF. The chip enable signal EN_I, the resolution setting signal RES, and the clock signal CLK are input from three input terminals IP1, IP2, and IP3, respectively. The reference voltage VREF is supplied from a reference voltage supply terminal VRP.

The control circuit 100 is a logic circuit configured to control operations of the voltage boosting circuit 101, the pixel drive circuit 102, n pieces of pixel units 110, and the output circuit 120 based on the chip enable signal EN_I, the resolution setting signal RES, and the clock signal CLK.

The control circuit 100 performs sampling on the resolution setting signal RES at a timing when the clock signal CLK rises. In a case where the resolution setting signal RES subjected to sampling has a high level, the control circuit 100 counts the number of times of continuously performing sampling on the resolution setting signal RES having a high level. If the count value is 2, the control circuit 100 stores bit data indicating a resolution of 300 dpi, in a resolution setting register (not illustrated). If the count value is 4, the control circuit 100 stores bit data indicating a resolution of 600 dpi, in the resolution setting register (not illustrated). If the count value is 8, the control circuit 100 stores bit data indicating a resolution of 1200 dpi, in the resolution setting register (not illustrated).

If a chip enable signal EN_I is changed from a low level to a high level, the control circuit 100 outputs a control signal to the voltage boosting circuit 101 at a predetermined timing.

After outputting the control signal to the voltage boosting circuit 101, the control circuit 100 generates a pixel selection signal SEL0 which is set to be active (high level in the exemplary embodiment) for a predetermined period, at a predetermined timing. The control circuit 100 outputs the generated pixel selection signal SEL0 to the first pixel unit 110.

After outputting the pixel selection signal SEL0, the control circuit 100 generates a second transfer control signal Tx2 based on the bit data which has been stored in the resolution setting register, at a predetermined timing. In the exemplary embodiment, the second transfer control signal Tx2 is configured by four signals Tx2*a*, Tx2*b*, Tx2*c*, and Tx2*d*, and a signal which becomes active (high level in the exemplary embodiment) is changed among the four signals, in accordance with the bit data which has been stored in the resolution setting register. Specifically, when the bit data indicates a resolution of 1200 dpi, in the second transfer control signal Tx2, only the signal Tx2a becomes active (high level) on the first cycle of the clock signal CLK, and only the Tx2b becomes active (high level) on the next one cycle of the clock signal CLK. In addition, only the signal Tx2c becomes active (high level) on the further next one cycle of the clock signal CLK, and only the Tx2d becomes active (high level) on furthermore the next one cycle of the clock signal CLK. When the bit data indicates a resolution of 600 dpi, in the second transfer control signal Tx2, only the two signals Tx2a and Tx2b simultaneously become active (high level) on the first cycle of the clock signal CLK, and only the two signals Tx2c and Tx2d simultaneously become active (high level) on the next one cycle. When the bit data indicates a resolution of 300 dpi, in the second transfer control signal Tx2, the four signals Tx2a, Tx2b, Tx2c, and Tx2d simultaneously become active (high level) on one cycle of the clock signal CLK.

The control circuit 100 outputs the pixel selection signal SEL0, and then outputs a control signal to the pixel drive circuit 102 at a predetermined timing.

The control circuit 100 outputs the pixel selection signal SEL0, and then generates a reset signal RST at a predetermined timing. The reset signal RST is a control signal for initializing charges accumulated in the n pieces of pixel units 110. In the exemplary embodiment, the reset signal RST is commonly supplied to n pieces of the pixel units 110. Thus, the image reading chip 415 includes a control signal line 300 for transferring the reset signal RST to n pieces of the pixel units 110.

The control circuit 100 outputs the pixel selection signal SEL0, and generates a sampling signal SMP at a predetermined timing.

The voltage boosting circuit 101 boosts the power source voltage VDD based on a control signal from the control circuit 100, and generates a first transfer control signal Tx1 in which the boosted power source voltage is defined to be a high level. The first transfer control signal Tx1 is a control signal for transferring charges which have been accumulated in the light receiving element for the exposure time Δt. The first transfer control signal Tx1 is commonly supplied to n pieces of the pixel units 110.

The pixel drive circuit 102 generates a drive signal Drv for driving n pieces of the pixel units 110, based on the control signal from the control circuit 100. The n pieces of the pixel units 110 are arranged in a line in one-dimensional direction. The drive signal Drv is transferred to the n pieces of the pixel units 110 by the drive signal line 311. Thus, when the drive signal Drv becomes active (high level), and the pixel selection signal SELi-1 is active (high level), the i-th (i is any of 1 to n) pixel unit 110 causes the pixel selection signal SELi to become active (high level), and outputs an output signal (pixel signal). The pixel selection signal SELi is output to the (i+1)th pixel unit 110.

Each of n pieces of the pixel units 110 includes a light receiving element which receives light from an image formed on a read medium, and performs photoelectric conversion. The light receiving element outputs a pixel signal of a voltage depending on light received for the exposure time Δt, based on the first transfer control signal Tx1, the second transfer control signal Tx2, the pixel selection signal SEL (any of SEL0 to SELn-1), the reset signal RST, and the drive signal Drv. Output signals (pixel signals) output from the n pieces of the pixel units 110 are sequentially transferred to the output circuit 120 by an output signal line 301. All of n pieces of the pixel units 110 have the same configuration. A specific circuit configuration and a specific operation will be described later.

The output circuit 120 performs predetermined signal processing on the pixel signal output from each of n pieces of the pixel units 110, so as to generate and output an image signal SO. In the exemplary embodiment, the output circuit 120 includes a correlated double sampling (CDS) circuit 121 and an amplification circuit 122.

The image signal Vo which sequentially includes pixel signals output from the n pieces of pixel units 110 is input to the CDS circuit 121 through the output signal line 301. The CDS circuit 121 deletes noise by correlated double sampling. The noise occurs by characteristic variation of amplification transistors in the n pieces of pixel units 110, and is superimposed on the image signal Vo. The correlated double sampling uses a reference voltage VREF as a reference. That is, the CDS circuit 121 is a noise reduction circuit in which noise included in the output signal (pixel signal) output from each of n pieces of the pixel units 110 is reduced.

The amplification circuit 122 performs sampling on a signal having noise removed by the CDS circuit 121, based on a sampling signal SMP. The amplification circuit 122 amplifies the signal subjected to sampling, so as to generate an image signal SO. That is, the amplification circuit 122 is an amplification circuit configured to amplify output signals (pixel signals) output from the n pieces of pixel units 110. As described above, the image signal SO is output from the image reading chip 415 through an output terminal OP1, and is supplied to the analog front end (AFE) 202 (see FIG. 5).

If the chip enable signal EN_I is changed from a high level to a low level, the control circuit 100 suspends an output of the image signal SO to the output circuit 120, and thus cause the output terminal OP1 to have high impedance. The control circuit 100 generates a chip enable signal EN_O (any of chip enable signals EN2 to ENm+1 in FIG. 5) which is set to be active (high level) for a predetermined period, and outputs the generated chip enable signal EN_O to the image reading chip 415 at the next stage, through the output terminal OP2.

Figure 7:
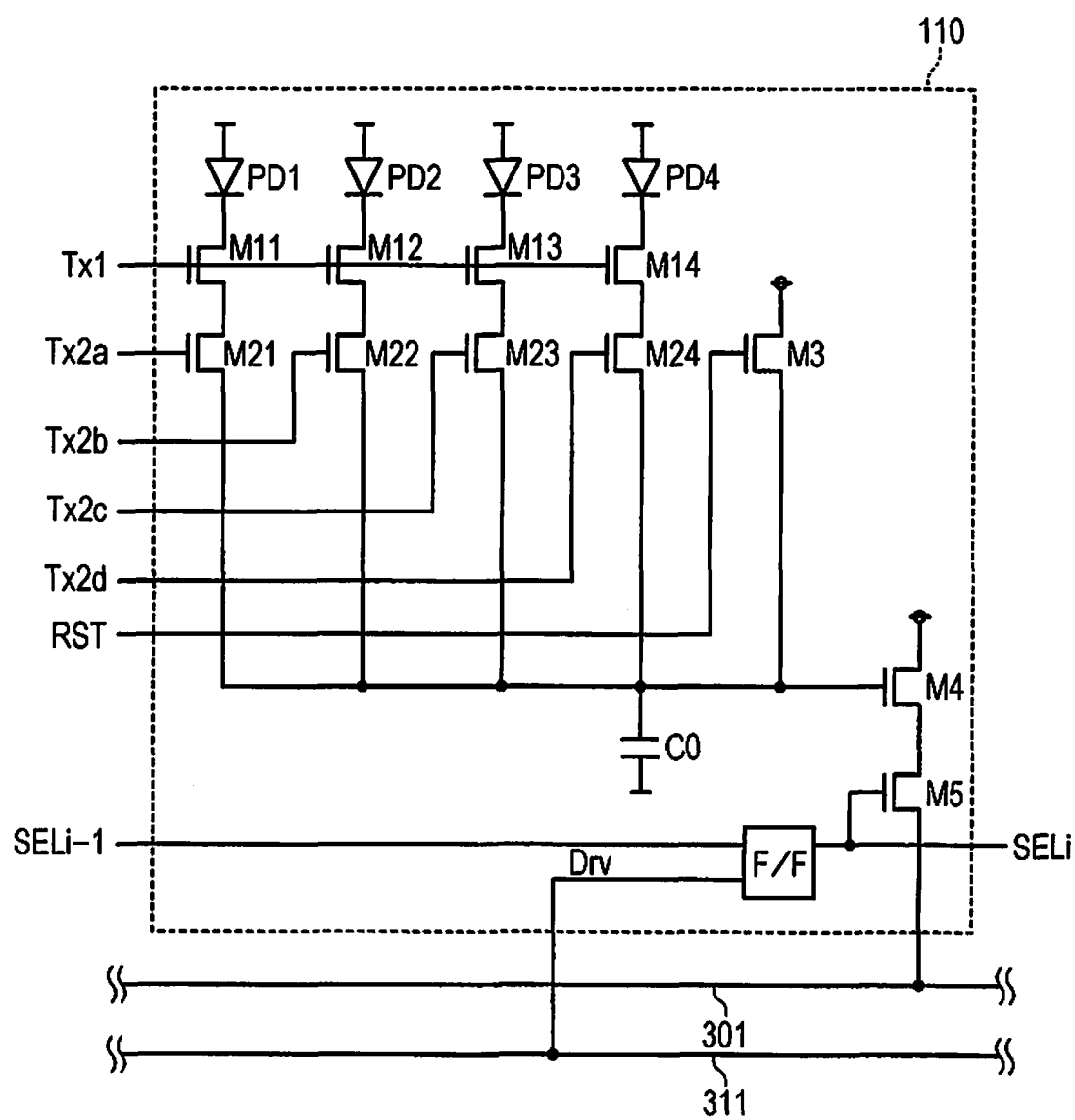
FIG. 7 is a diagram illustrating a configuration of a pixel unit.

FIG. 7 is a diagram illustrating a configuration of the pixel unit 110 (i-th pixel unit 110). As illustrated in FIG. 7, the pixel unit 110 includes four light receiving elements PD1, PD2, PD3, and PD4. That is, the pixel unit 110 includes four pixels.

The light receiving elements PD1, PD2, PD3, and PD4 receives light (in the exemplary embodiment, light from an image formed on a read medium), and converts (photoelectrically-converts) the received light into an electric signal. In the exemplary embodiment, each of the light receiving elements PD1, PD2, PD3, and PD4 is configured by a photodiode, and has a grounded anode. A cathode of the light receiving element PD1 is connected to a source of an NMOS transistor M11, and a cathode of the light receiving element PD2 is connected to a source of an NMOS transistor M12. A cathode of the light receiving element PD3 is connected to a source of an NMOS transistor M13, and a cathode of the light receiving element PD4 is connected to a source of an NMOS transistor M14.

A drain of the NMOS transistor M11 is connected to a source of an NMOS transistor M21, and a drain of the NMOS transistor M12 is connected to a source of an NMOS transistor M22. A drain of the NMOS transistor M13 is connected to a source of an NMOS transistor M23, and a drain of the NMOS transistor M14 is connected to a source of an NMOS transistor M24. The first transfer control signal Tx1 is supplied to a gate of each of the four NMOS transistors M11, M12, M13, and M14.

A drain of each of the four NMOS transistors M21, M22, M23, and M24 is commonly connected to the source of the NMOS transistor M3, the gate of the NMOS transistor M4, and one end of a capacitor having capacitance C0. Another end of the capacitor having capacitance C0 is grounded. The signal Tx2a is supplied to the gate of the NMOS transistor M21, and the signal Tx2b is supplied to the gate of the NMOS transistor M22. The signal Tx2c is supplied to the gate of the NMOS transistor M23, and the signal Tx2d is supplied to the gate of the NMOS transistor M24.

The power source voltage is supplied to the drain of the NMOS transistor M3, and the reset signal RST is supplied to the gate of the NMOS transistor M3.

The power source voltage is supplied to the drain of the NMOS transistor M4, and the source of the NMOS transistor M4 is connected to the drain of the NMOS transistor M5.

The source of the NMOS transistor M5 is connected to the output signal line 301. An output signal (pixel selection signal SELi) of a flip-flop (F/F) is supplied to the gate of the NMOS transistor M5.

The pixel selection signal SELi-1 and the drive signal Drv are input to the flip-flop (F/F). The flip-flop (F/F) captures the pixel selection signal SELi-1 at a rising edge of the input drive signal Drv, and outputs the delayed pixel selection signal SELi. The pixel selection signal SELi passes through a delay circuit (not illustrated), and thus functions as an asynchronous reset signal of the flip-flop (F/F). Thus, the pixel selection signal SELi becomes active (high level), and then becomes inactive (low level) after a predetermined period elapses.

The i-th pixel unit 110 which has the above-described configuration operates as follows. Firstly, all of the first transfer control signal Tx1, the second transfer control signals Tx2 (TX2a, TX2b, TX2c, and TX2d), the pixel selection signal SELi-1, the drive signal Drv is inactive (low level) for the exposure time Δt. The light receiving elements PD1, PD2, PD3, and PD4 accumulate charges (negative charges) in accordance with received light.

Then, only the first transfer control signal Tx1 becomes active (high level), and all of the four NMOS transistors M11, M12, M13, and M14 turn ON. Thus, charges (negative charges) accumulated in the light receiving element PD1 are transferred to intermediate accumulation capacitance C1 (not illustrated) which is formed at a connection node of the drain of the NMOS transistor M11 and the source of the NMOS transistor M21. Charges (negative charges) accumulated in the light receiving element PD2 are transferred to intermediate accumulation capacitance C2 (not illustrated) which is formed at a connection node of the drain of the NMOS transistor M12 and the source of the NMOS transistor M22. Charges (negative charges) accumulated in the light receiving element PD3 are transferred to intermediate accumulation capacitance C3 (not illustrated) which is formed at a connection node of the drain of the NMOS transistor M13 and the source of the NMOS transistor M23. Charges (negative charges) accumulated in the light receiving element PD4 are transferred to intermediate accumulation capacitance C4 (not illustrated) which is formed at a connection node of the drain of the NMOS transistor M14 and the source of the NMOS transistor M24.

Then, the first transfer control signal Tx1 becomes inactive (low level). The drive signal Drv which is supplied to the pixel unit 110 repeats activeness (high level) and inactiveness (low level) for each of a half cycle of the clock signal CLK.

The reset signal RST becomes active (high level) for a predetermined period, for each cycle of the clock signal CLK. Thus, the NMOS transistor M3 turns ON and the capacitance C0 is initialized. Then, a predetermined amount of charges (positive charges) are accumulated in the capacitor for the capacitance C0. After the reset signal RST returns to being inactive (low level), at least one of the four signals Tx2a, Tx2b, Tx2c, and Tx2d constituting the second transfer control signal Tx2 becomes active (high level) for a predetermined period, for each cycle of the clock signal CLK.

Specifically, when the resolution is set to be 1200 dpi, firstly, only the signal Tx2a becomes active (high level) for a predetermined period, in one cycle of the clock signal CLK. Then, only the signal Tx2b becomes active (high level) for a predetermined period, in one cycle of the clock signal CLK. Then, only the signal Tx2c becomes active (high level) for a predetermined period, in one cycle of the clock signal CLK. Then, only the signal Tx2d becomes active (high level) for a predetermined period, in one cycle of the clock signal CLK. The four signals Tx2a, Tx2b, Tx2c, and Tx2d repeat the state as described above.

When the resolution is set to be 600 dpi, firstly, only the two signals Tx2a and Tx2b become active (high level) for a predetermined period, in one cycle of the clock signal CLK. Then, only the two signals Tx2c and Tx2d become active (high level) for a predetermined period, in one cycle of the clock signal CLK.

When the resolution is set to be 300 dpi, only the four signals Tx2a, Tx2b, Tx2c, and Tx2d become active (high level) for a predetermined period, in one cycle of the clock signal CLK. The four signals Tx2a, Tx2b, Tx2c, and Tx2d repeat the state as described above.

If at least one of the four signals Tx2a, Tx2b, Tx2c, and Tx2d becomes active (high level) for the predetermined period, at least one of the four NMOS transistors M21, M22, M23, and M24 turns ON, and the predetermined amount of charges (positive charges) accumulated in the capacitor of capacitance C0 are reduced by charges (negative charges) accumulated in at least one of pieces of the intermediate accumulation capacitance C1, C2, C3, and C4.

In the pixel unit 110 which is to read a pixel signal, the pixel selection signal SELi-1 becomes active (high level) for a predetermined period. After the reset signal RST returns to being inactive (low level), the pixel selection signal SELi becomes active (high level) for a predetermined period.

Thus, the NMOS transistor M5 turns ON, and a current flowing in the NMOS transistor M4 is changed depending on the charges accumulated in the capacitor of the capacitance C0. Thus, a source potential of the NMOS transistor M4 is changed, and a pixel signal of a voltage depending on the source potential of the NMOS transistor M4 is output from the pixel unit 110 to the output signal line 301.

In the pixel unit 110 which is not to read the pixel signal, the pixel selection signal SELi-1 maintains being inactive (low level). Thus, the pixel selection signal SELi also has a low level. Thus, the NMOS transistor M5 turns OFF, and the pixel signal is not output from the pixel unit 110.

An output of the voltage boosting circuit 101 is used as gate signals of the four NMOS transistor M11, M12, M13, and M14, in order to transfer charges with high efficiency for a short time. However, in a case where any problem does not occur in transfer efficiency and accuracy, the four NMOS transistor M11, M12, M13, and M14 may be driven by using the power source voltage. In this case, the voltage boosting circuit 101 is not required.

Figure 8:
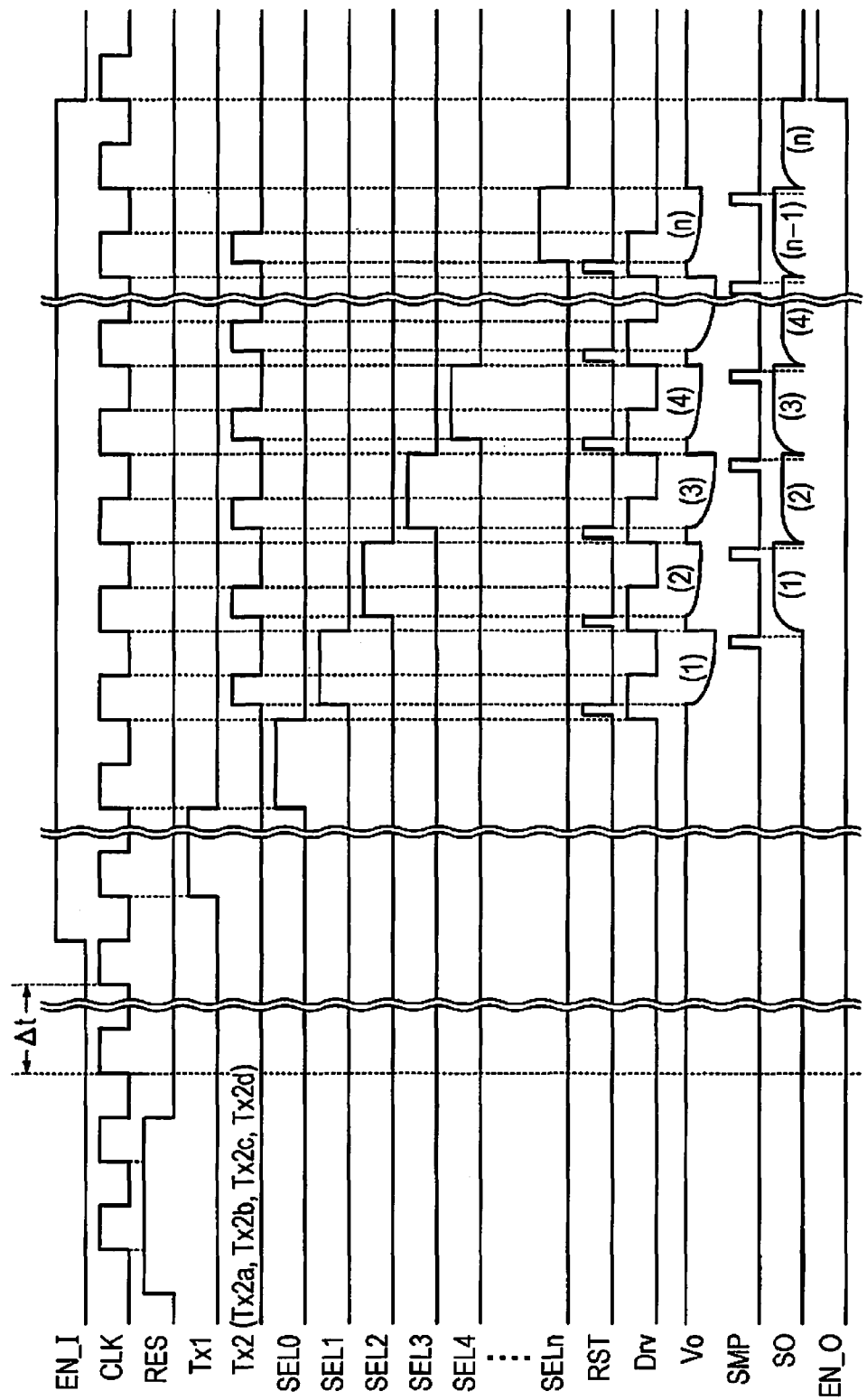
FIG. 8 is a timing chart illustrating each signal of the image reading chip.

FIG. 8 is a timing chart of each signal of the image reading chip 415. FIG. 8 is a timing chart in a case where a resolution at which the scanner unit (image reading apparatus) 3 reads an image is set to 300 dpi.

As illustrated in FIG. 8, firstly, the resolution setting signal RES has a high level for two cycles of the clock signal CLK. If the exposure time Δt elapses, the chip enable signal EN_I becomes active (high level) for a predetermined period, and then various signals at 300 dpi are supplied to each of the pixel units 110.

After the chip enable signal EN_I becomes active (high level), firstly, the first transfer control signal Tx1 becomes active (high level) for several cycles of the clock signal CLK.

Then, the pixel selection signal SEL0 becomes active (high level) for one cycle of the clock signal CLK.

Then, for the half cycle of the clock signal CLK, the drive signal Drv becomes active (high level), and the first transfer control signal Tx1 and the pixel selection signal SEL0 become inactive (low level) together. The reset signal RST which is delayed a little becomes active (high level) for a short time.

Then, after the reset signal RST returns to being inactive (low level), all of the four signals Tx2a, Tx2b, Tx2c, and Tx2d constituting the second transfer control signal Tx2 become active (high level) until the clock signal CLK falls for the next time. The pixel selection signal SEL1 becomes active (high level). Thus, the pixel signal from the first pixel unit 110 is output to the output signal line 301, and the image signal Vo has a voltage depending on the pixel signal. The image signal Vo is subjected to signal processing in the output circuit 120. The image signal SO has a voltage corresponding to the first pixel signal, with synchronization with falling of the sampling signal SMP.

Then, the drive signal Drv becomes active (high level) and the pixel selection signal SEL1 become inactive (low level), for the half cycle of the clock signal CLK. The reset signal RST which is delayed a little becomes active (high level) for a short time.

Then, after the reset signal RST returns to being inactive (low level), all of the four signals Tx2a, Tx2b, Tx2c, and Tx2d become active (high level) until the clock signal CLK falls for the next time. The pixel selection signal SEL2 becomes active (high level). Thus, the pixel signal from the second pixel unit 110 is output to the output signal line 301, and the image signal Vo has a voltage depending on the pixel signal. The image signal Vo is subjected to signal processing in the output circuit 120. The image signal SO has a voltage corresponding to the second pixel signal, with synchronization with falling of the sampling signal SMP.

Then, the drive signal Drv becomes active (high level) and the pixel selection signal SEL2 become inactive (low level), for the half cycle of the clock signal CLK. The reset signal RST which is delayed a little becomes active (high level) for a short time.

In the following descriptions, similarly, the image signal SO has a voltage depending on pixel signals of the third to n-th pixel units, with synchronization with falling of the sampling signal SMP.

After that, the chip enable signal EN_I is changed from being active (high level) to being inactive (low level), and the output terminal OP1 has high impedance. The chip enable signal EN_O becomes active (high level) for a predetermined period.

4. Layout Configuration of Image Reading Chip

Figure 9:
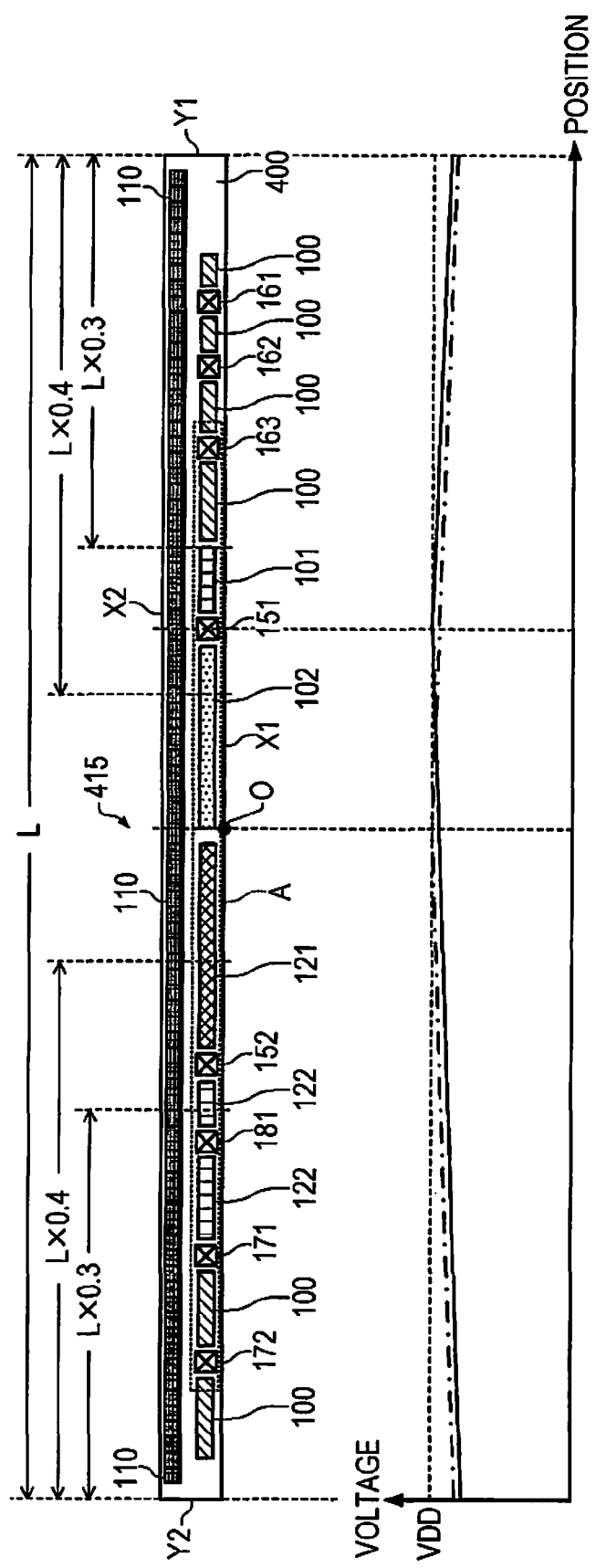
FIG. 9 is a diagram illustrating a layout configuration of the image reading chip.
Figure 10:
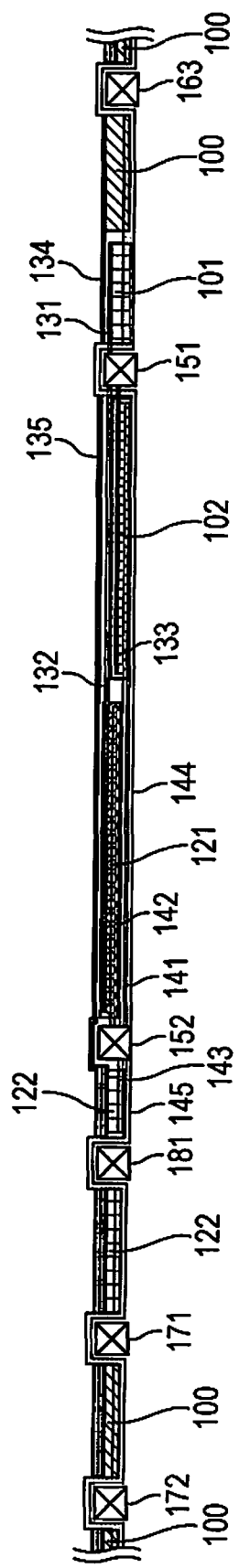
FIG. 10 is an enlarged view of a region A indicated by a broken line in FIG. 9.

FIG. 9 is a diagram illustrating a layout configuration of the image reading chip 415. FIG. 9 illustrates a layout configuration when the semiconductor substrate 400 of the image reading chip 415 is viewed in plan. FIG. 9 illustrates only circuit blocks and pads constituting the image reading chip 415. FIG. 10 is an enlarged view of a region A indicated by a broken line in FIG. 9. FIG. 10 also illustrates a power source wiring.

As illustrated in FIG. 9, the image reading chip 415 has a shape including a first side X1 and a second side Y1 shorter than the first side X1. For example, in the image reading chip 415, the first side X1 has the same length as a third side X2 which faces the first side X1, the second side Y1 has the same length as a fourth side Y2 which faces the second side Y1, and the first side X1 is perpendicular to the second side Y1. That is, the image reading chip 415 may have a rectangular shape.

In the exemplary embodiment, the image sensor module 41 is a line sensor. Thus, as illustrated in FIG. 9, in the image reading chip 415, a plurality (m pieces) of pixel units 110 is arranged in a line in the direction along the first side X1. Thus, the image reading chip 415 has an elongated shape in which the first side X1 is much longer than the second side Y1.

The image reading chip 415 includes two power source pads 151 and 152, three input pads 161, 162, and 163, two output pads 171 and 172, and a reference-voltage supply pad 181.

Each of the two power source pads 151 and 152 is electrically connected to the power source terminals VDP and VSP in FIG. 6, by bonding wires and the like. That is, the power source pad 151 is a first power source pad to which the power source voltage VDD which is a first power source voltage is supplied. The power source pad 152 is a second power source pad to which a power source voltage VSS which is a second power source voltage lower than the first power source voltage is applied.

Each of the three input pads 161, 162, and 163 is electrically connected to the input terminals IP1, IP2, and IP3 in FIG. 6, by bonding wires and the like. That is, each of the three input pads 161, 162, and 163 is a pad for inputting the chip enable signal EN_I, the resolution setting signal RES, and the clock signal CLK which are input signals to the image reading chip 415.

Each of the two output pads 171 and 172 is electrically connected to the output terminals OP1 and OP2 in FIG. 6, by bonding wires and the like. That is, each of the two output pads 171 and 172 is a pad for outputting the image signal SO and the chip enable signal EN_O which are output signals from the image reading chip 415.

The reference-voltage supply pad 181 is electrically connected to the reference voltage supply terminal VRP in FIG. 6, by a bonding wire and the like. That is, the reference-voltage supply pad 181 is a pad to which the reference voltage VREF is supplied.

As illustrated in FIG. 9, in order to reduce the length of the second side Y1, and to reduce a chip area, the analog circuit (voltage boosting circuit 101, pixel drive circuit 102, CDS circuit 121, and amplification circuit 122), the logic circuit (control circuit 100), the power source pads 151 and 152, the input pads 161, 162, and 163, the output pads 171 and 172, and the reference-voltage supply pad 181 are arranged in the direction along the first side X1. Specifically, control circuits 100 are separately disposed at six places. That is, the control circuits 100 are disposed on an outer side of the input pad 161, between the input pad 161 and the input pad 162, between the input pad 162 and the input pad 163, on the input pad 163 side between the input pad 163 and the power source pad 151, in a space from the voltage boosting circuit 101, between the output pad 171 and the output pad 172, and on an outer side of the output pad 172. The voltage boosting circuit 101 is disposed on the power source pad 151 side between the input pad 163 and the power source pad 151. The pixel drive circuit 102 is disposed on the power source pad 151 side between the power source pad 151 and the power source pad 152. The CDS circuit 121 is disposed on the power source pad 152 side between the power source pad 151 and the power source pad 152. Amplification circuits 122 are separately disposed at two places, that is, between the power source pad 152 and the reference-voltage supply pad 181, and between the reference-voltage supply pad 181 and the output pad 171.

In particle, in the exemplary embodiment, a distance between the voltage boosting circuit 101 (which is the analog circuit) and the median point O of the first side X1 is shorter than a distance between the control circuit 100 (which is the logic circuit) and the median point O of the first side X1. A distance between the voltage boosting circuit 101 and the power source pad 151 is shorter than a distance between the control circuit 100 and the power source pad 151. Similarly, a distance between the pixel drive circuit 102 (which is the analog circuit) and the median point O of the first side X1 is shorter than a distance between the control circuit 100 (which is the logic circuit) and the median point O of the first side X1. A distance between the pixel drive circuit 102 and the power source pad 151 is shorter than a distance between the control circuit 100 and the power source pad 151. A distance between the CDS circuit 121 (which is the analog circuit) and the median point O of the first side X1 is shorter than a distance between the control circuit 100 (which is the logic circuit) and the median point O of the first side X1. Further, a distance between the CDS circuit 121 and the power source pad 152 is shorter than a distance between the control circuit 100 and the power source pad 152. Similarly, a distance between the amplification circuit 122 (which is the analog circuit) and the median point O of the first side X1 is shorter than a distance between the control circuit 100 (which is the logic circuit) and the median point O of the first side X1. Further, a distance between the amplification circuit 122 and the power source pad 151 is shorter than a distance between the control circuit 100 and the power source pad 151.

In other words, in the image reading chip 415, any of the voltage boosting circuit 101, the pixel drive circuit 102, the CDS circuit 121, and the amplification circuit 122 which are analog circuits is disposed at a place which is on an inner side (close to the center of the chip) of the control circuit 100 which is a logic circuit, and is nearer to the power source pad 151 or the power source pad 152 than the control circuit 100. Thus, since the image reading chip 415 has an elongated shape, a power source wiring in the direction along the first side X1 is significantly long. However, a power source wiring from the power source pad 151 or the power source pad 152 to the voltage boosting circuit 101, the pixel drive circuit 102, the CDS circuit 121, and the amplification circuit 122 is relatively short, and the dropped amount of the power source voltage VDD or the raised amount of the power source voltage VSS due to wiring resistance is small. It is difficult to cause the voltage boosting circuit 101, the pixel drive circuit 102, the CDS circuit 121, and the amplification circuit 122 to receive an influence of power source noise occurring by a switching operation in the control circuit 100 which is a logic circuit. Thus, the voltage boosting circuit 101, the pixel drive circuit 102, the CDS circuit 121, and the amplification circuit 122 which are analog circuits, and thus have characteristics which easily fluctuate by the power source voltage receive the power source voltages VDD and VSS which are stably supplied, and operate. Accordingly, it is possible to improve capability for reading an image.

As illustrated in FIG. 9, a distance between the power source pad 151 and the median point O of the first side X1 is shorter than a distance between the input pads 161, 162, and 163, and the median point O of the first side X1, and is shorter than a distance between the output pads 171 and 172, and the median point O of the first side X1. Similarly, a distance between the power source pad 152 and the median point O of the first side X1 is shorter than a distance between the input pads 161, 162, and 163, and the median point O of the first side X1, and is shorter than a distance between the output pads 171 and 172, and the median point O of the first side X1. In other words, in the image reading chip 415, the power source pads 151 and 152 are disposed on an inner side (close to the center of the chip) of the input pads 161, 162, and 163 or the output pads 171 and 172. Thus, it is possible to cause a distance between the power source pads 151 and 152, and a circuit which is farthest from the power source pads 151 and 152 to be relatively short. If the power source pads 151 and 152 are disposed in the vicinity of the median point O of the first side X1, it is possible to reduce a distance from the circuit which is farthest, to the minimum. However, in the exemplary embodiment, as illustrated in FIG. 9, the power source pads 151 and 152 is not disposed in the vicinity of the median point O of the first side X1, but is disposed in a region which corresponds to 30% to 40% of the length L of the first side X1, from the second side Y1 or the fourth side Y2 which faces the second side Y1. Thus, the dropped amount of the power source voltage VDD supplied to the CDS circuit 121, the amplification circuit 122, and the control circuit 100 (control circuit 100 in the vicinity of the output pads 171 and 172) is slightly increased in comparison to a case where the power source pad 151 is disposed at the median point O of the first side X1 (one dot chain line), as indicated by a solid line in FIG. 9, which indicates voltage drop of the power source voltage illustrated with the width of the image reading chip 415 in FIG. 9. However, voltage drop as much as the characteristics of the CDS circuit 121 or the amplification circuit 122 which are analog circuits are influenced more does not occur. In addition, since the control circuit 100 in which voltage drop occurs largest is a logic circuit, an erroneous operation is not performed. The above-descriptions may be applied to a case of voltage rising of the power source voltage VSS, similarly.

As illustrated in FIG. 9, in the exemplary embodiment, a region in which the pixel drive circuit 102 and the CDS circuit 121 can be disposed may be ensured between the power source pad 151 and the power source pad 152. The voltage boosting circuit 101 and the pixel drive circuit 102 may be disposed on both sides of the power source pad 151, respectively. The CDS circuit 121 and the amplification circuit 122 may be disposed on both sides of the power source pad 152, respectively. That is, the voltage boosting circuit 101 and the pixel drive circuit 102 are provided at positions which are nearer to the power source pad 151 than the power source pad 152. The CDS circuit 121 and the amplification circuit 122 are provided at positions which are nearer to the power source pad 152 than the power source pad 151.

Thus, as illustrated in FIG. 10, in the exemplary embodiment, power source wirings 131, 132, and 133 (examples of the first power source wiring) and power source wirings 134 and 135 (examples of the second power source wiring) are branched at a position of the power source pad 151. The power source wirings 131, 132, and 133 are used for performing electrical connections between the voltage boosting circuit 101 (which is an analog circuit) and the power source pad 151, between the CDS circuit 121 (which is an analog circuit) and the power source pad 151, and between the pixel drive circuit 102 (which is an analog circuit) and the power source pad 151. The power source wirings 134 and 135 are used for performing electrical connection between the control circuit 100 (which is a logic circuit) and the power source pad 151. Power source wirings 141, 142, and 143 (examples of the first power source wiring) and power source wirings 144 and 145 (examples of the second power source wiring) are branched at a position of the power source pad 152. The power source wirings 141, 142, and 143 are used for performing electrical connections between the pixel drive circuit 102 (which is an analog circuit) and the power source pad 152, between the CDS circuit 121 (which is an analog circuit) and the power source pad 152, and between the amplification circuit 122 (which is an analog circuit) and the power source pad 152. The power source wirings 144 and 145 are used for performing electrical connection between the control circuit 100 (which is a logic circuit) and the power source pad 152. Thus, in the image reading chip 415, the voltage boosting circuit 101 which needs large power, the pixel drive circuit 102 in which a timing when a drive signal is generated easily fluctuates by the power source voltage, and the CDS circuit 121 or the amplification circuit 122 of which characteristics easily fluctuate by the power source voltage receive the power source voltages VDD and VSS which are stably supplied, so as to operate, and are infrequently influenced by power source noise which occurs by the switching operation in the control circuit 100. Accordingly it is possible to improve capability for reading an image.

As illustrated in FIG. 10, in a plan view of the image reading chip 415, the power source wirings 131, 132, and 133 (examples of the first power source wiring) and the power source wirings 134 and 135 (examples of the second power source wiring) are provided so as not to overlap the power source pad 152. The power source wirings 141, 142, and 143 (examples of the third power source wiring) and power source wirings 144 and 145 (examples of the fourth power source wiring) are provided so as not to overlap the power source pad 151. In other words, all of the power source wirings 131, 132, 133, 134, 135, 141, 142, 143, 144, and 145 are provided in the same wiring layer as that for the power source pads 151 and 152. The wiring layers may be different from each other only at a portion at which one of the power source wirings 131, 132, 133, 134, and 135 on which the power source voltage VDD is transmitted overlaps one of the power source wirings 141, 142, 143, 144, and 145 on which the power source voltage VSS is transmitted. Thus, all of these power source wirings or the power source pads 151 and 152 are realized only in the two wiring layers. Thus, it is possible to simplify manufacturing processes, and to reduce cost of manufacturing the image reading chip 415.

As illustrated in FIG. 9, in the exemplary embodiment, the input pads 161, 162, and 163 are provided at positions which are near the second side Y1. The output pads 171 and 172 are provided at positions which are far from the second side Y1. Some of the control circuits 100 to which signals input from the input pads 161, 162, and 163 are supplied are disposed in the vicinity of the input pads 161, 162, and 163. A portion of the amplification circuit 122 configured to generate signals to be output from the output pads 171 and 172, or some of the control circuits 100 are disposed in the vicinity of the output pads 171 and 172. In other words, in the image reading chip 415, the length of each of the signal wirings on which the input signal, the internal signal, and the output signal are transmitted is reduced. Thus, in the image reading chip 415, it is possible to improve characteristics of the voltage boosting circuit 101, the pixel drive circuit 102, the CDS circuit 121, and the amplification circuit 122, and to improve capability for reading an image.

5. Advantages

As described above, in a scanner unit (image reading apparatus) 3 according to the exemplary embodiment, in the image reading chip (semiconductor device) 415, the power source pads 151 and 152 are disposed so as to be close to the center, and the analog circuits (voltage boosting circuit 101, pixel drive circuit 102, CDS circuit 121, and amplification circuit 122) are disposed at four places which are on both sides of the power source pad 151 and on both sides of the power source pad 152. Thus, power is stably supplied to the analog circuits. The power source wirings 131, 132, 133, 141, 142, and 143 for supplying power to the analog circuits, and the power source wirings 134, 135, 144, and 145 for supplying power to the logic circuit (control circuit 100) are branched at the positions of the power source pads 151 and 152. Thus, it is difficult to cause the analog circuits to be influenced by power source noise which occurs due to an operation of the logic circuit. Thus, according to the scanner unit (image reading apparatus) 3 and the image reading chip (semiconductor device) 415 in the exemplary embodiment, it is possible to improve accuracy in reading an image. Since a portion which makes a detour around the pads becomes thin in order to lengthen the power source wirings 134 and 135 and to reduce the length of the second side Y1, the power source voltage VDD is dropped largely. However, voltage drop does not occur as much as being less than a logical threshold voltage of the logic circuit (control circuit 100). Thus, the logic circuit (control circuit 100) does not perform an erroneous operation.

According to the scanner unit (image reading apparatus) 3 in the exemplary embodiment, in the image reading chip (semiconductor device) 415, the analog circuits (voltage boosting circuit 101, pixel drive circuit 102, CDS circuit 121, and amplification circuit 122), the logic circuits (control circuits 100), and the pads (power source pads 151 and 152, input pads 161, 162, and 163, output pads 171 and 172, and the reference-voltage supply pad 181) are arranged in the direction along the first side X1. Thus, it is possible to reduce the length of the second side Y1, and to reduce the chip area.

According to the scanner unit (image reading apparatus) 3 in the exemplary embodiment, in a plan view of the image reading chip (semiconductor device) 415, the power source wirings 131, 132, 133, 134, and 135 on which the power source voltage VDD is transmitted do not overlap the power source pad 152 to which the power source voltage VSS is supplied. In addition, the power source wirings 141, 142, 143, 144, and 145 on which the power source voltage VSS is transmitted, and the power source pad 151 to which the power source voltage VDD is supplied are disposed so as not to overlap each other. Thus, the power source wirings 131, 132, 133, 134, 135, 141, 142, 143, 144, and 145 or the power source pads 151 and 152 may be realized only in the two wiring layers.

6. Modification Example

In the image reading chip 415, a positional relationship between one of the power source pads 151 and 152, and the control circuit 100, the voltage boosting circuit 101, the pixel drive circuit 102, the CDS circuit 121, and the amplification circuit 122 or the power source wirings 131, 132, 133, 134, 135, 141, 142, 143, 144, and 145 may be different from that in the exemplary embodiment. That is, the positional relationship may be established only on one side from the center of the image reading chip 415.

Hitherto, the exemplary embodiment or the modification examples are described. However, the invention is not limited to the exemplary embodiment or the modification examples, and may be implemented in various forms in the scope without departing from the gist of the invention. For example, the exemplary embodiment and the modification examples may be appropriately combined.

The invention includes substantially the same configuration (for example, configuration having the same function, the same method, and the same result, or configuration having the same purpose and the same effect) as the configuration described in the exemplary embodiment. The invention includes a configuration obtained by substituting portions which are not essential in the configuration described in the exemplary embodiment. The invention includes a configuration which can have the same advantage as that of the configuration described in the exemplary embodiment, and may achieve the same purpose as that of the configuration. The invention includes a configuration obtained by adding a known technology to the configuration described in the exemplary embodiment.

What is claimed is:

1. An image reading apparatus comprising:
an image reading chip for reading an image,
wherein
the image reading chip includes
a plurality of pixel units which include a light receiving element which receives light from the image so as to perform photoelectric conversion,
an analog circuit,
a logic circuit, and
a power source pad to which a power source voltage is supplied,
the image reading chip has a shape which includes a first side and a second side shorter than the first side,
the plurality of pixel units is arranged in a line in a direction along the first side,
a distance between the analog circuit and a median point of the first side is shorter than a distance between the logic circuit and the median point of the first side, and
a distance between the analog circuit and the power source pad is shorter than a distance between the logic circuit and the power source pad.

2. The image reading apparatus according to claim 1, wherein
the image reading chip includes an input pad for inputting an input signal to the image reading chip, and an output pad for outputting an output signal from the image reading chip, and
a distance between the power source pad and the median point of the first side is shorter than a distance between the input pad and the median point of the first side, and is shorter than a distance between the output pad and the median point of the first side.

3. The image reading apparatus according to claim 2, wherein
the analog circuit, the logic circuit, the power source pad, the input pad, and the output pad are arranged in the direction along the first side.

4. The image reading apparatus according to claim 1, wherein
the image reading chip includes a first power source wiring for electrically connecting the analog circuit and the power source pad, and a second power source wiring for electrically connecting the logic circuit and the power source pad, and
the first power source wiring and the second power source wiring are branched at a position of the power source pad.

5. The image reading apparatus according to claim 1, wherein
the power source pad includes a first power source pad to which a first power source voltage is supplied, and a second power source pad to which a second power source voltage lower than the first power source voltage is supplied.

6. The image reading apparatus according to claim 1, wherein
the power source pad includes a first power source pad to which a first power source voltage is supplied, and a second power source pad to which a second power source voltage lower than the first power source voltage is supplied,
the image reading chip includes a first power source wiring for electrically connecting the analog circuit and the first power source pad, a second power source wiring for electrically connecting the logic circuit and the first power source pad, a third power source wiring for electrically connecting the analog circuit and the second power source pad, and a fourth power source wiring for electrically connecting the logic circuit and the second power source pad, and
in a plan view of the image reading chip, the first power source wiring and the second power source wiring are provided so as not to overlap the second power source pad, and the third power source wiring and the fourth power source wiring are provided so as not to overlap the first power source pad.

7. The image reading apparatus according to claim 1, wherein
the analog circuit includes a voltage boosting circuit configured to boost the power source voltage.

8. The image reading apparatus according to claim 1, wherein
the analog circuit includes a pixel drive circuit configured to generate a drive signal for driving the pixel unit.

9. The image reading apparatus according to claim 1, wherein
the analog circuit includes a noise reduction circuit configured to reduce noise included in an output signal output from the pixel unit.

10. The image reading apparatus according to claim 1, wherein
the analog circuit includes an amplification circuit configured to amplify an output signal output from the pixel unit.

11. The image reading apparatus according to claim 5, wherein
the analog circuit includes a voltage boosting circuit configured to boost the power source voltage, a pixel drive circuit configured to generate a drive signal for driving the pixel unit, a noise reduction circuit configured to reduce noise included in an output signal output from the pixel unit, and an amplification circuit configured to amplify the output signal, the voltage boosting circuit and the pixel drive circuit are provided at a position which is nearer to the first power source pad than the second power source pad, and the noise reduction circuit and the amplification circuit are provided at a position which is nearer to the second power source pad than the first power source pad.

12. A semiconductor device which has a shape including a first side and a second side shorter than the first side, the device comprising:

a plurality of pixel units which include a light receiving element which receives light so as to perform photoelectric conversion;

an analog circuit;

a logic circuit; and a power source pad to which a power source voltage is supplied, wherein the plurality of pixel units is arranged in a line in a direction along the first side, a distance between the analog circuit and a median point of the first side is shorter than a distance between the logic circuit and the median point of the first side, and a distance between the analog circuit and the power source pad is shorter than a distance between the logic circuit and the power source pad.

* * * * *